United States Patent
Lee

(10) Patent No.: US 8,022,805 B2
(45) Date of Patent: *Sep. 20, 2011

(54) SPIRAL INDUCTOR DEVICE

(75) Inventor: Sheng-Yuan Lee, Taipei County (TW)

(73) Assignee: Via Technologies, Inc., Hsin-Tien, Taipei (TW)

( * ) Notice: Subject to any disclaimer, the term of this patent is extended or adjusted under 35 U.S.C. 154(b) by 319 days.

This patent is subject to a terminal disclaimer.

(21) Appl. No.: 12/032,778

(22) Filed: Feb. 18, 2008

(65) Prior Publication Data

US 2009/0096566 A1    Apr. 16, 2009

(30) Foreign Application Priority Data

Oct. 12, 2007    (TW) ................................ 96138201 A

(51) Int. Cl.
- H01F 21/02    (2006.01)
- H01F 27/29    (2006.01)
- H01F 5/00    (2006.01)
- H01F 27/28    (2006.01)

(52) U.S. Cl. ......... 336/232; 336/138; 336/192; 336/200

(58) Field of Classification Search ................... 336/138, 336/192, 200, 232

See application file for complete search history.

(56) References Cited

U.S. PATENT DOCUMENTS

| | | | |
|---|---|---|---|
| 5,936,299 A * | 8/1999 | Burghartz et al. | 257/531 |
| 6,002,161 A * | 12/1999 | Yamazaki | 257/531 |
| 6,870,256 B2 * | 3/2005 | Aoki et al. | 257/700 |
| 7,126,452 B2 * | 10/2006 | Teshima et al. | 336/200 |
| 7,626,480 B2 * | 12/2009 | Lee | 336/200 |
| 7,642,618 B2 * | 1/2010 | Shiramizu et al. | 257/531 |
| 2002/0113290 A1 | 8/2002 | Lemaire | |
| 2005/0247999 A1 * | 11/2005 | Nishikawa et al. | 257/531 |

OTHER PUBLICATIONS

CN Office Action mailed Sep. 18, 2009.
"Design of Analog CMOS Integrated Circuits" Behzad Razavi; Chapt. 14, p. 409, 412, and 425; pub. by Xian Jiaotong University Press; Feb. 28, 2003 and English translation.

* cited by examiner

*Primary Examiner* — Anh Mai
*Assistant Examiner* — Ronald Hinson
(74) *Attorney, Agent, or Firm* — Thomas|Kayden

(57) ABSTRACT

A spiral inductor device is provided. The spiral inductor device comprises an insulating layer disposed on a substrate. A spiral conductive trace with multiple turns is disposed on the insulating layer, wherein the outermost turn and the innermost turn of the spiral conductive trace have a first end and a second end, respectively, and one of the first and second ends is connected to ground. A non-continuous spiral conductive trace with a single turn is disposed on the insulating layer, parallel and adjacent to the turn that belongs to the spiral conductive trace and is extended from the end of the spiral conductive trace without being connected to ground, wherein the non-continuous spiral conductive trace is connected to the ground.

18 Claims, 6 Drawing Sheets

SPIRAL INDUCTOR DEVICE

BACKGROUND OF THE INVENTION

1. Field of the Invention

The invention relates to semiconductor integrated circuits and more particularly to a spiral inductor device.

2. Description of the Related Art

Many digital and analog elements and circuits have been successfully applied to semiconductor integrated circuits. Such elements may include passive components, such as resistors, capacitors, or inductors. Typically, a semiconductor integrated circuit includes a silicon substrate. One or more dielectric layers are disposed on the substrate, and one or more metal layers are disposed in the dielectric layers or thereon. The metal layers may be employed to form on-chip elements, such as on-chip inductors, by current semiconductor technologies.

Conventionally, an on-chip inductor is formed over a semiconductor substrate and employed in integrated circuits designed for the radio frequency (RF) band. FIGS. 1A and 1B illustrate a plan view of a conventional on-chip inductor device with a planar spiral configuration and a cross-section along 1B-1B' line shown in FIG. 1A, respectively. The on-chip inductor device is formed on an insulating layer 102 on a substrate 100, comprising a spiral conductive trace 103 and an interconnect structure. The spiral conductive trace 103 is disposed on the insulating layer 102. The interconnect structure includes conductive plugs 105 and 109 and a conductive layer 107 embedded in the insulating layer 102 and a signal output/input conductive trace 111 on the insulating layer 102. An internal circuit of the chip or an external circuit may provides a current passing through the coil, which includes the spiral conductive trace 103, the conductive plugs 105 and 109, the conductive layer 107, and the signal output/input conductive trace 111. A principle advantage of the planar spiral inductor device is the increased level of circuit integration due to the reduced number off-chip circuit elements and the complex interconnections required thereby. Moreover, the planar spiral inductor can reduce parasitic effect induced by the bond pads or bond wires between on-chip and off-chip circuits.

For a spiral inductor device, the quality factor (Q value) or inductor performance is reduced due to the conductor loss produced by the spiral conductive trace, the parasitic capacitor between the spiral conductive trace and the semiconductor substrate, and the substrate loss produced by the coupling between the spiral conductive trace and the semiconductor substrate. To reduce the conductor loss, increase of the thickness and the width of the spiral conductive trace have been proposed. Additionally, to reduce substrate loss, the use of a grounding metal shielding layer, interposed between the spiral conductive trace and the semiconductor substrate, has been proposed. Although the metal shielding layer can reduce the coupling between the spiral conductive trace and the semiconductor substrate, an additional parasitic capacitor is formed between the metal shielding layer and the semiconductor substrate so as to increase the parasitic capacitance between the spiral conductive trace and the semiconductor substrate.

Since the performance of integrated circuit devices is based on the Q value of the inductor devices, there is a need to develop an inductor device with increased Q value.

BRIEF SUMMARY OF INVENTION

A detailed description is given in the following embodiments with reference to the accompanying drawings.

Spiral inductor devices are provided. An embodiment of a spiral inductor device comprises an insulating layer disposed on a substrate. A spiral conductive trace with multiple turns is disposed on the insulating layer, wherein the outermost turn and the innermost turn of the spiral conductive trace have a first end and a second end, respectively, and one of the first and second ends is connected to ground. A non-continuous spiral conductive trace with a single turn is disposed on the insulating layer, parallel and adjacent to the turn that belongs to the spiral conductive trace and is extended from the end of the spiral conductive trace without being connected to ground, wherein the non-continuous spiral conductive trace is connected to the ground.

Another embodiment of a spiral inductor device comprises an insulating layer disposed on a substrate. A spiral conductive trace with multiple turns is disposed on the insulating layer. A first conductive segment is disposed on the insulating layer, parallel and adjacent to the outermost turn of the spiral conductive trace, wherein the first conductive segment is connected to ground. A second conductive segment is disposed on the insulating layer, parallel and adjacent to the innermost turn of the spiral conductive trace. A connecting trace is disposed in the insulating layer and electrically connected between the first and second conductive segments.

Further another embodiment of a spiral inductor device comprises an insulating layer disposed on a substrate. A spiral conductive trace with multiple turns is disposed on the insulating layer, wherein the outermost turn and the innermost turn of the spiral conductive trace have a first end and a second end, respectively, and one of the first and second ends is connected to ground. A conductive segment is disposed on the insulating layer, parallel and adjacent to the turn that belongs to the spiral conductive trace and is extended from the end of the spiral conductive trace without being connected to ground, wherein the conductive segment is connected to ground.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims. The inductor device of the invention will be described in the following with reference to the accompanying drawings.

Figure 1A:
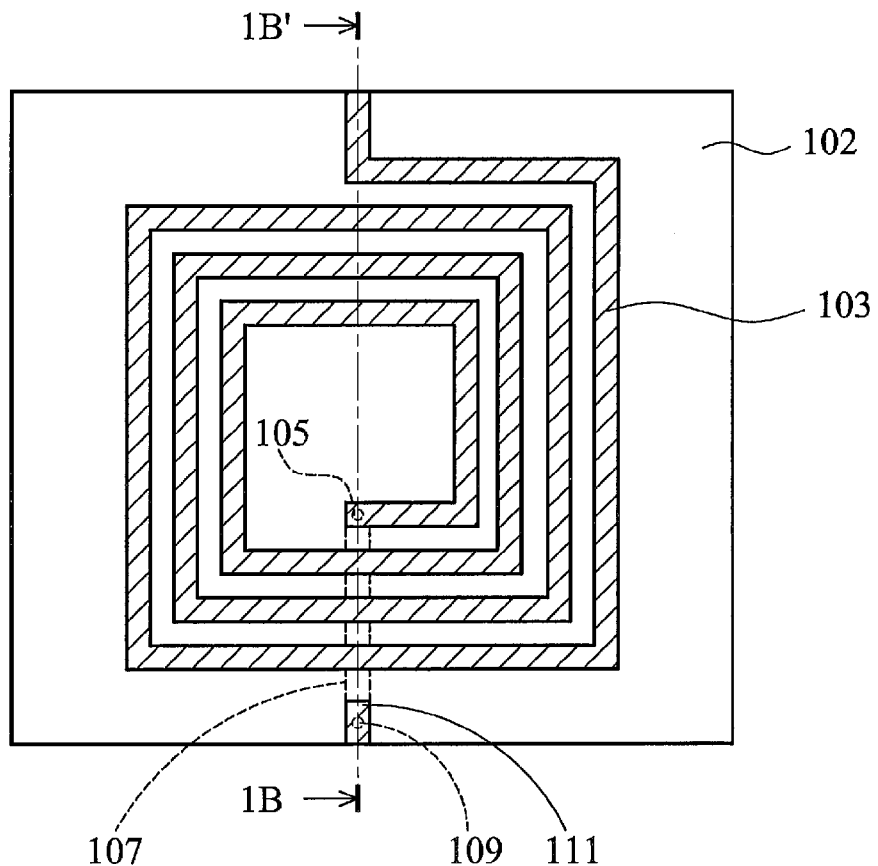
FIG. 1A is a plan view of a conventional on-chip inductor device with a planar spiral configuration.
Figure 1B:
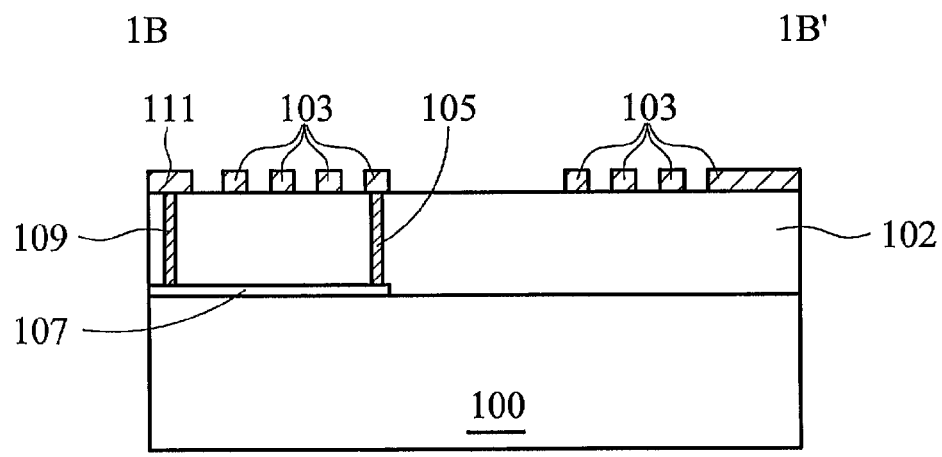
FIG. 1B shows a cross section along 1B-1B' line shown in FIG. 1A.
Figure 2A:
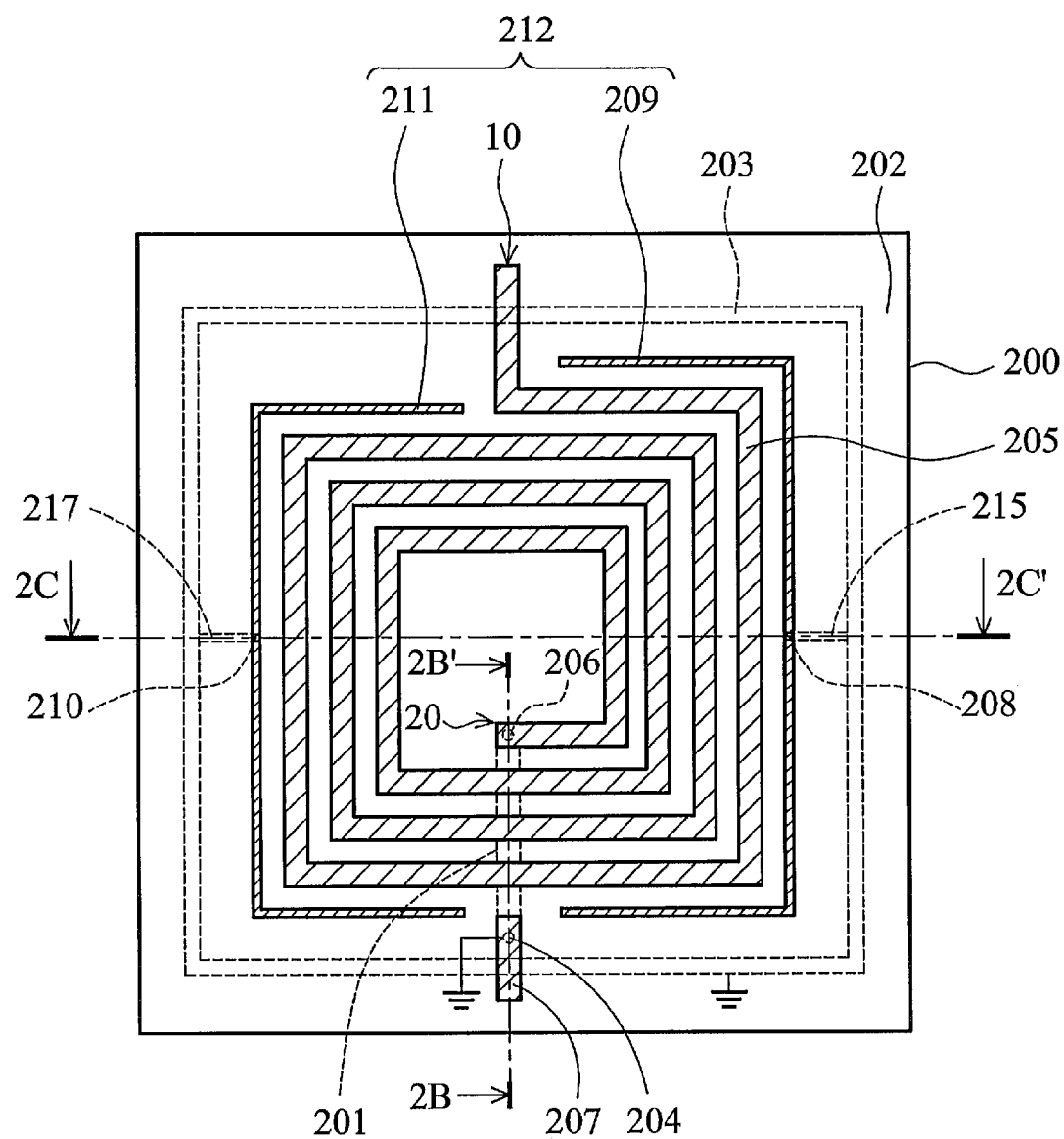
FIG. 2A is a plan view of an embodiment of a spiral inductor device.
Figure 2B:
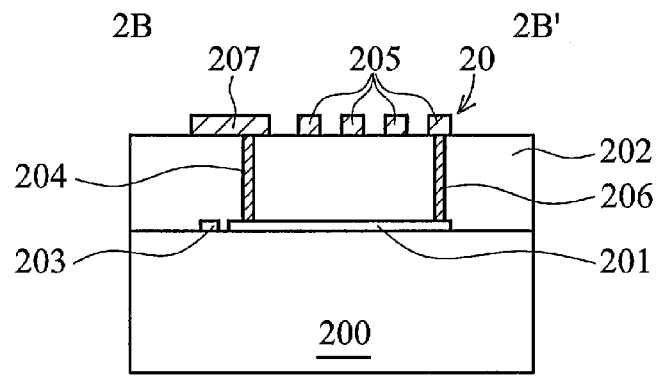
FIG. 2B shows a cross section along 2B-2B' line shown in FIG. 2A.
Figure 2C:
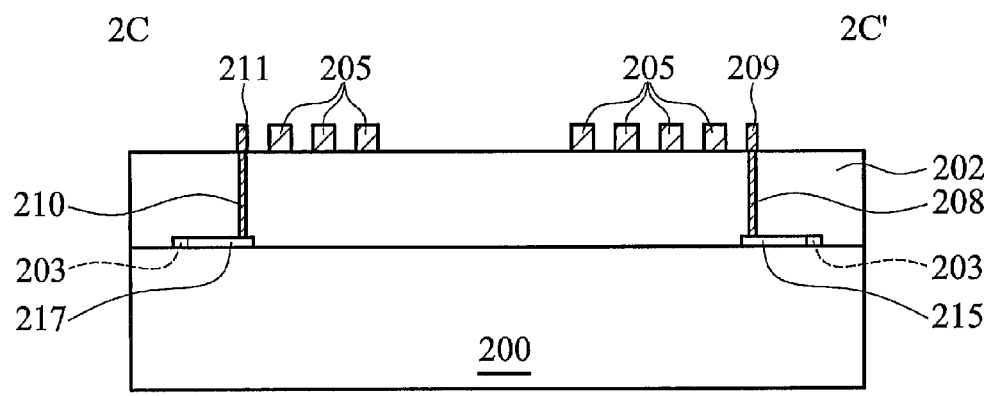
FIG. 2C shows a cross section along 2C-2C' line shown in FIG. 2A.

Referring to FIGS. 2A to 2C, in which FIG. 2A is a plan view of an embodiment of a spiral inductor device, FIG. 2B shows a cross section along 2B-2B' line shown in FIG. 2A, and FIG. 2C shows a cross section along 2C-2C' line shown in FIG. 2A. The spiral inductor device comprises an insulating layer 202, a spiral conductive trace 205 with multiple turns, a non-continuous spiral conductive trace 212 with a single turn, a guard ring 203, and at least two connecting traces 215 and 217. The insulating layer 202 is disposed on a substrate 200. The substrate 200 may include a silicon substrate or other well-known semiconductor substrate. The substrate 200 may include various elements, such as transistors, resistors, or other well-known semiconductor elements. Moreover, the substrate 200 may also include other conductive layers (e.g. copper, aluminum, or alloy thereof) and insulating layers (e.g. silicon oxide, silicon nitride, or low-k dielectric material). Hereinafter, to simplify the diagram, only a flat substrate is depicted.

The spiral conductive trace 205 with multiple turns is disposed on the insulating layer 202 and may comprise, for example, three turns. The spiral conductive trace 205 with multiple turns may be circular, rectangular, hexagonal, octagonal or polygonal. Hereinafter, only an exemplary rectangular spiral conductive trace is depicted. Moreover, the spiral conductive trace 205 with multiple turns may comprise copper, aluminum or alloy thereof. The outermost turn and the innermost turn of the spiral conductive trace 205 with multiple turns have a first end 10 and a second end 20, respectively, in which the second end 20 is electrically connected to an interconnect structure for serving as a signal output/input terminal. The interconnect structure comprises a conductive layer 207 disposed on the insulating layer 202 outside the spiral conductive trace 205, a conductive layer 201 embedded in the insulating layer 202, a conductive plug 204 electrically connected between the conductive layers 201 and 207, and a conductive plug 206 electrically connected between the conductive layer 201 and the second end 20 of the spiral conductive trace 205, as shown in FIG.2B. In the embodiment, the second end 20 of the innermost turn of the spiral conductive trace 205 with multiple turns is connected to ground by the conductive layer 207, as shown in FIG. 2A. Accordingly, the electric field at outer turns of the spiral conductive trace 205 with multiple turns is larger than that at inner turns of the spiral conductive trace 205 with multiple turns and the outermost turn has the largest electric field.

The non-continuous spiral conductive trace 212 with a single turn is disposed on the insulating layer 202 and may comprise a plurality of separated conductive segments, such as the conductive segments 209 and 211. The non-continuous spiral conductive trace 212 and the spiral conductive trace 205 may be defined by the same conductive layer. However, note that the non-continuous spiral conductive trace 212 has a line width narrower than that of the spiral conductive trace 205. In the embodiment, the non-continuous spiral conductive trace 212 is located outside, parallel and adjacent to the outermost turn of the spiral conductive trace 205 with multiple turns and is connected to ground. That is, the non-continuous spiral conductive trace 212 substantially surrounds the turn that belongs to the spiral conductive trace 205 and is extended from the end (i.e. the first end 10) of the spiral conductive trace 205 without being connected to ground. In the embodiment, some of the electric field at the outermost turn of the spiral conductive trace 205 can be eliminated by grounding the non-continuous spiral conductive trace 212 due to the coupling effect between the outermost turn of the spiral conductive trace 205 and the non-continuous spiral conductive trace 212, thereby reducing induced energy in the substrate 200. As a result, substrate loss can be reduced to enhance the Q value of the inductor device.

The guard ring 203 is disposed in the insulating layer 202 and is connected to ground. Moreover, the guard ring 203 surrounds the spiral conductive trace 205 to eliminate noise. The connecting traces 215 and 217 are also disposed in the insulating layer 202. As shown in FIG. 2C, one end of the connecting trace 215 and one end of the connecting trace 217 respectively extend to the guard ring 203. Another end of the connecting trace 215 is electrically connected to the conductive segment 209 by a conductive plug 208 in the insulating layer 202. Another end of the connecting trace 217 is electrically connected to the conductive segment 211 by a conductive plug 210 in the insulating layer 202. That is, the non-continuous spiral conductive trace 212 is connected to ground by the connecting trances 215 and 217, the conductive plugs 208 and 210, and the guard ring 203. In another embodiment, the non-continuous spiral conductive trace 212 can be connected to ground without by the guard ring 203.

Additionally, note that although the spiral conductive trace 205 with three turns is depicted in an exemplary embodiment, the spiral conductive trace 205 may comprise two or more than three turns.

Figure 3:
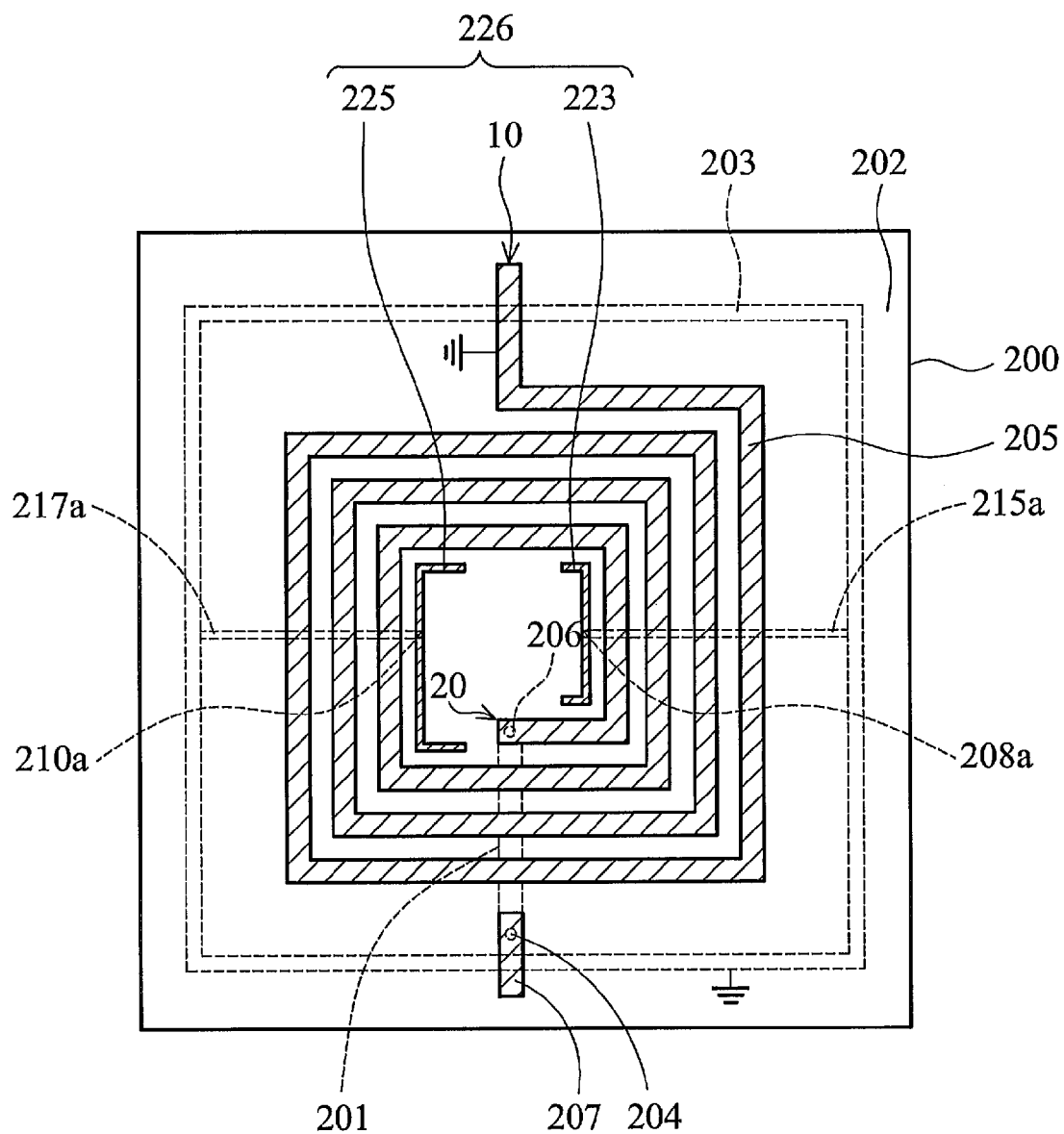
FIG. 3 is a plan view of an embodiment of a spiral inductor device.

Referring to FIG. 3, in which FIG. 3 is a plan view of an embodiment of a spiral inductor device. Elements in FIG. 3 that are the same as in FIG. 2A are labeled the same and not described further again for brevity. In this embodiment, the spiral inductor device comprises an insulating layer 202, a spiral conductive trace 205 with multiple turns, a non-continuous spiral conductive trace 226 with a single turn, a guard ring 203, and at least two connecting traces 215a, and 217a. Moreover, the first end 10 of the outermost turn of the spiral conductive trace 205 is connected to ground. Accordingly, the electric field at inner turns of the spiral conductive trace 205 with multiple turns is larger than that at outer turns of the spiral conductive trace 205 with multiple turns and the innermost turn has the largest electric field.

The non-continuous spiral conductive trace 226 with a single turn is disposed on the insulating layer 202 and may comprise a plurality of separated conductive segments, such as the conductive segments 223 and 225. The non-continuous spiral conductive trace 226 and the spiral conductive trace 205 may be defined by the same conductive layer. Moreover, the non-continuous spiral conductive trace 212 has a line width narrower than that of the spiral conductive trace 205. In the embodiment, the non-continuous spiral conductive trace 226 is located inside, parallel and adjacent to the innermost turn of the spiral conductive trace 205 with multiple turns and is connected to ground. That is, the turn that belongs to the spiral conductive trace 205 and is extended from the end (i.e. the second end 20) of the spiral conductive trace 205 without being connected to ground substantially surrounds the non-continuous spiral conductive trace 226. In the embodiment, some of the electric field at the innermost turn of the spiral conductive trace 205 can be eliminated by grounding non-continuous spiral conductive trace 226 due to the coupling effect between the innermost turn of the spiral conductive trace 205 and the non-continuous spiral conductive trace 226, thereby enhancing the Q value of the inductor device.

The connecting traces 215a, and 217a, are disposed in the insulating layer 202. One end of the connecting trace 215a, and one end of the connecting trace 217a, respectively extend to the guard ring 203. Another end of the connecting trace 215a, is electrically connected to the conductive segment 223 by a conductive plug 208a, in the insulating layer 202.

Another end of the connecting trace 217a, is electrically connected to the conductive segment 225 by a conductive plug 210a, in the insulating layer 202. That is, the non-continuous spiral conductive trace 226 is connected to ground by the connecting trances 215a, and 217a,, the conductive plugs 208a, and 210a,, and the guard ring 203. In another embodiment, the non-continuous spiral conductive trace 226 can be connected to ground without by the guard ring 203.

Figure 4:
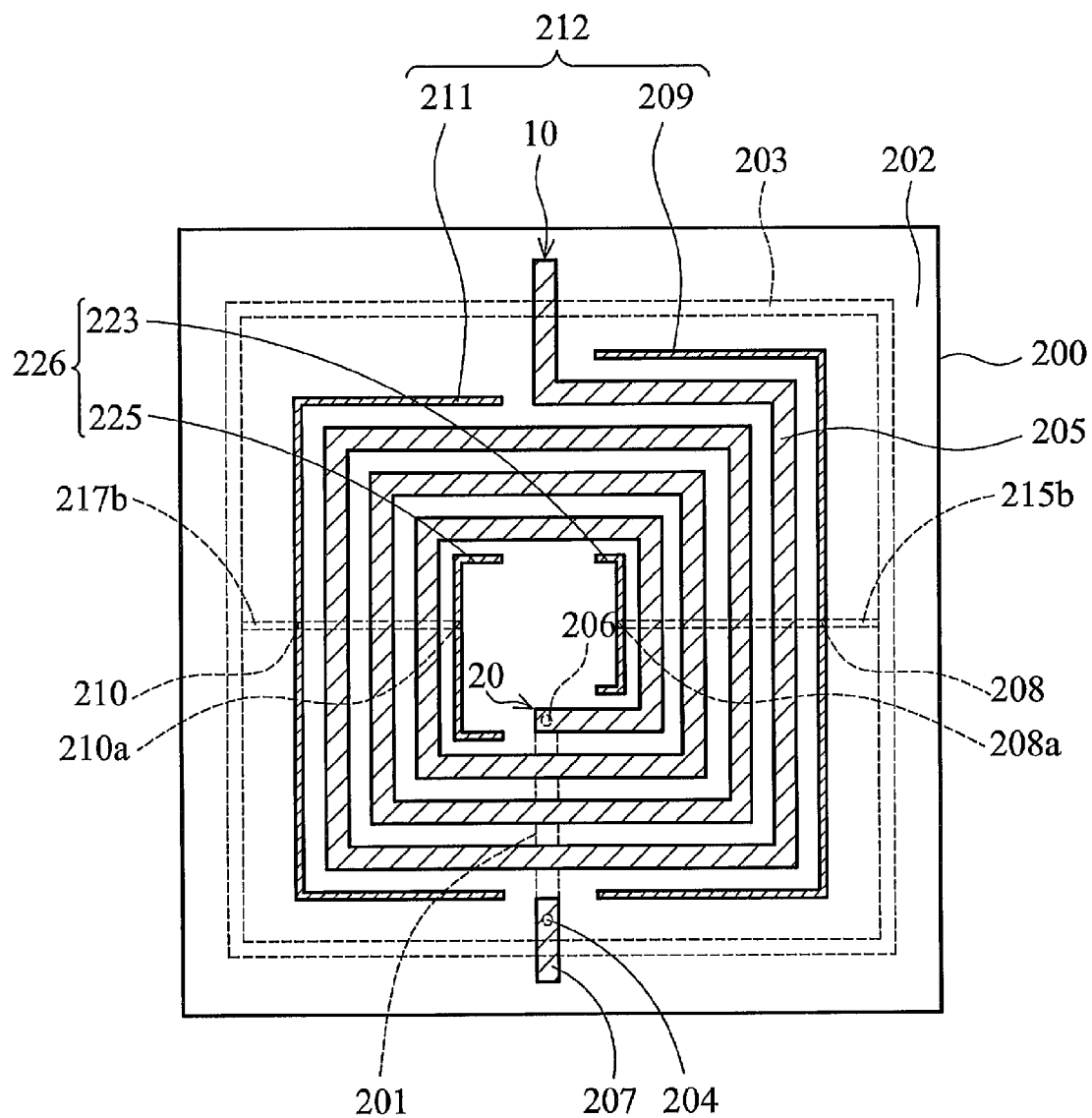
FIG. 4 is a plan view of an embodiment of a spiral inductor device.

Referring to FIG. 4, in which FIG. 4 is a plan view of an embodiment of a spiral inductor device. Elements in FIG. 4 that are the same as in FIGS. 2A and 3 are labeled the same and not described further again for brevity. In this embodiment, the spiral inductor device comprises an insulating layer 202, a spiral conductive trace 205 with multiple turns, conductive segments 209, 211, 223 and 225, a guard ring 203, and at least two connecting traces 215b, and 217b.

The conductive segments 209, 211, 223 and 225 have a line width narrower than that of the spiral conductive trace 205. In the embodiment, the conductive segments 209 and 211 are located outside, parallel and adjacent to the outermost turn of the spiral conductive trace 205 with multiple turns and are connected to ground. The conductive segments 223 and 225 are located inside, parallel and adjacent to the innermost turn of the spiral conductive trace 205 with multiple turns.

The connecting traces 215b, and 217b, are disposed in the insulating layer 202. One end of the connecting trace 215b, and one end of the connecting trace 217b, respectively extend to the guard ring 203. The connecting trace 215b, is electrically connected between the conductive segments 209 and 223 by conductive plugs 208 and 208a, in the insulating layer 202. The connecting trace 217b, is electrically connected between the conductive segments 211 and 225 by conductive plugs 210 and 210a, in the insulating layer 202. That is, the conductive segments 209, 211, 223 and 225 are connected to ground by the connecting trances 215b, and 217b,, the conductive plugs 208, 208a,, 210 and 210a,, and the guard ring 203. In another embodiment, only two conductive segments are respectively located outside and inside the spiral conductive trace 205. The conductive segment located outside and adjacent to the outermost turn of the spiral conductive trace 205, and the other conductive segment located inside and adjacent to the innermost turn of the spiral conductive trace 205 are electrically connected by a single conductive trace. For example, only a conductive segment 211 is located outside and adjacent to the outermost turn of the spiral conductive trace 205 and only a conductive segment 225 is located inside and adjacent to the innermost turn of the spiral conductive trace 205. Moreover, a connecting trace 217b, is electrically connected between the conductive segments 211 and 225. Alternatively, only a conductive segment 209 is located outside and adjacent to the outermost turn of the spiral conductive trace 205 and only a conductive segment 223 is located inside and adjacent to the innermost turn of the spiral conductive trace 205. Moreover, a connecting trace 215b, is electrically connected between the conductive segments 209 and 223. Additionally, the spiral inductor device may have a single conductive segment 209, 211, 223, or 225 that is connected to ground. Note that the conductive segment is located adjacent to the turn that belongs to the spiral conductive trace 205 and is extended from the end of the spiral conductive trace 205 without being connected to ground. Also, such a conductive segment can be electrically connected to the grounding guard ring 203 by a connecting trace 215b, or 217b.

Figure 5:
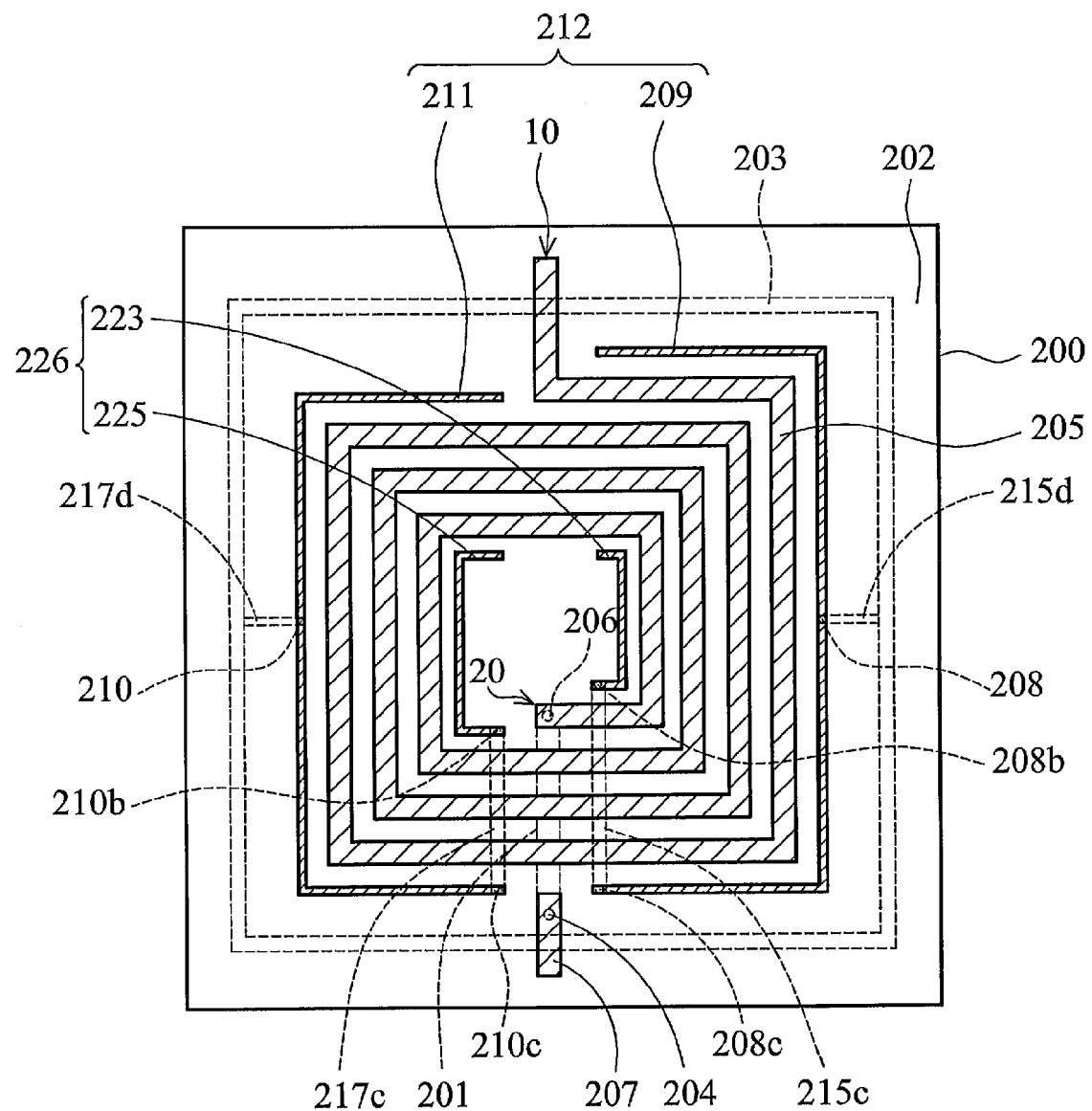
FIG. 5 is a plan view of an embodiment of a spiral inductor device.

In some embodiments, as shown in FIG. 5, one end of the conductive segment 209 is electrically connected to one end of the conductive segment 223 by a connecting trace 215c, and conductive plugs 208b, and 208c. One end of the conductive segment 211 is electrically connected to one end of the conductive segment 225 by a connecting trace 217c and conductive plugs 210b, and 210c. Moreover, the conductive segments 209 and 223 are connected to ground by a conductive plug 208 and a connecting trace 215d, extending to the guard ring 203. The conductive segments 211 and 225 are connected to ground by a conductive plug 210 and a connecting trace 217d, extending to the guard ring 203. Additionally, it is understood that the connecting traces 215c, and 217c, may be connected to ground by extending to the grounding guard ring 203, respectively, rather than by the connecting traces 215d, and 217d.

In the aforementioned embodiments, regardless of whether the first end 10 or the second end 20 of the spiral conductive trace 205 is connected to ground, the grounding conductive segments 209, 211, 223 and 225 can eliminate some of the electric field at the innermost turn and/or the outmost turn of the spiral conductive trace 205, thereby enhancing the Q value of the inductor device.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A spiral inductor device, comprising:
an insulating layer disposed on a substrate;
a spiral conductive trace with multiple turns disposed on the insulating layer,
wherein the outermost turn and the innermost turn of the spiral conductive trace have a first end and a second end, respectively, and one of the first and second ends is connected to ground; and
a first non-continuous spiral conductive trace with a single turn disposed on the insulating layer and comprising at least a first conductive segment and a second conductive segment, wherein the first non-continuous spiral conductive trace is connected to the ground;
wherein one of the outermost turn and innermost turn of the spiral conductive trace, which extends from the other one of the first and second ends that is not connected to ground, is parallel and adjacent to the first non-continuous spiral conductive trace;
wherein the first conductive segment and second conductive segment are arranged on both sides of a straight line passing through a central area surrounded by the spiral conductive trace, respectively.

2. The spiral inductor device as claimed in claim 1, further comprising a second non-continuous spiral conductive trace with a single turn disposed on the insulating layer and comprising at least a third conductive segment and a fourth conductive segment, parallel and adjacent to the turn that belongs to the spiral conductive trace and is extended from the end of the spiral conductive trace connected to ground, wherein the second non-continuous spiral conductive trace is connected to the ground and wherein the third conductive segment and fourth conductive segment are arranged on both sides of the straight line, respectively.

3. The spiral inductor device as claimed in claim 2, wherein the first and second non-continuous spiral conductive traces have a line width narrower than that of the spiral conductive trace.

4. The spiral inductor device as claimed in claim 1, wherein the spiral conductive trace is circular, rectangular, hexagonal, octagonal or polygonal.

5. The spiral inductor device as claimed in claim 2, further comprising at least two connecting traces disposed on the insulating layer and electrically connected between the first and second non-continuous spiral conductive traces.

6. The spiral inductor device as claimed in claim 2, further comprising a guard ring disposed in the insulating layer and surrounding the spiral conductive trace, wherein the first and second non-continuous spiral conductive traces are connected to ground by the guard ring.

7. The spiral inductor device as claimed in claim 2, wherein the spiral inductor device comprises first and second connecting traces, one end of the first conductive segment is connected to one end of the third conductive segment by the first connecting trace, and the one end of the second conductive segment is connected to one end of the fourth conductive segment by the second connecting trace.

8. The spiral inductor device as claimed in claim 1, wherein the second end of the spiral conductive trace is connected to ground and the first non-continuous spiral conductive trace substantially surrounds the spiral conductive trace.

9. The spiral inductor device as claimed in claim 1, wherein the first end of the spiral conductive trace is connected to ground and the spiral conductive trace substantially surrounds the first non-continuous spiral conductive trace.

10. A spiral inductor device, comprising:
   an insulating layer disposed on a substrate;
   a spiral conductive trace with multiple turns disposed on the insulating layer;
   a first conductive segment disposed on the insulating layer, parallel and adjacent to the outermost turn of the spiral conductive trace, wherein the first conductive segment is connected to ground;
   a second conductive segment disposed on the insulating layer, parallel and adjacent to the innermost turn of the spiral conductive trace; and
   a first connecting trace disposed in the insulating layer and electrically connected between the first and second conductive segments;
   wherein the first conductive segment and second conductive segment are arranged on a first side of a straight line passing through a central area surrounded by the spiral conductive trace.

11. The spiral inductor device as claimed in claim 10, further comprising a guard ring disposed in the insulating layer and surrounding the spiral conductive trace, wherein the first conductive segment is connected to ground by the guard ring.

12. The spiral inductor device as claimed in claim 10, further comprising:
   a third conductive segment disposed on the insulating layer, parallel and adjacent to the outermost turn of the spiral conductive trace, wherein the third conductive segment is connected to ground;
   a fourth conductive segment disposed on the insulating layer, parallel and adjacent to the innermost turn of the spiral conductive trace; and
   a second connecting trace disposed in the insulating layer and electrically connected between the third and fourth conductive segments;
   wherein the third conductive segment and fourth conductive segment are arranged on a second side opposite to the first side of the straight line.

13. The spiral inductor device as claimed in claim 12, wherein one end of the third conductive segment is connected to one end of the fourth conductive segment by the second connecting trace.

14. The spiral inductor device as claimed in claim 12, wherein the third and fourth conductive segments have a line width narrower than that of the spiral conductive trace.

15. The spiral inductor device as claimed in claim 12, further comprising a guard ring disposed in the insulating layer and surrounding the spiral conductive trace, wherein the third conductive segment is connected to ground by the guard ring.

16. The spiral inductor device as claimed in claim 10, wherein one end of the first conductive segment is connected to one end of the second conductive segment by the first connecting trace.

17. The spiral inductor device as claimed in claim 10, wherein the first and second conductive segments have a line width narrower than that of the spiral conductive trace.

18. The spiral inductor device as claimed in claim 10, wherein the spiral conductive trace is circular, rectangular, hexagonal, octagonal or polygonal.

* * * * *